United States Patent
Arrien

(10) Patent No.: US 10,482,186 B2
(45) Date of Patent: Nov. 19, 2019

(54) METHOD FOR AUTOMATICALLY DETERMINING A FINISHING RECIPE OF A MANUFACTURED COMPONENT

(71) Applicant: Francois-Imran Arrien, Montreal (CA)

(72) Inventor: Francois-Imran Arrien, Montreal (CA)

(73) Assignee: AV&R Vision and Robotics Inc., Montreal (CA)

(*) Notice: Subject to any disclaimer, the term of this patent is extended or adjusted under 35 U.S.C. 154(b) by 325 days.

(21) Appl. No.: 13/847,014

(22) Filed: Mar. 19, 2013

(65) Prior Publication Data
US 2014/0283378 A1 Sep. 25, 2014

(51) Int. Cl.
G06F 17/00 (2019.01)
G06F 9/00 (2006.01)
G05B 19/00 (2006.01)
G06F 17/50 (2006.01)

(52) U.S. Cl.
CPC .............. G06F 17/50 (2013.01); Y10T 29/53 (2015.01)

(58) Field of Classification Search
None
See application file for complete search history.

(56) References Cited

U.S. PATENT DOCUMENTS

| 4,755,952 | A | 7/1988 | Johns |
| 5,521,847 | A | 5/1996 | Ostrowski et al. |
| 6,568,993 | B1 | 5/2003 | Jones et al. |
| 6,775,586 | B2 * | 8/2004 | Shibata ............. G05B 19/41 409/183 |
| 7,014,533 | B2 | 3/2006 | Bolz et al. |
| 7,097,539 | B2 | 8/2006 | Moeller et al. |
| 7,335,089 | B1 | 2/2008 | Thompson |
| 7,433,799 | B2 | 10/2008 | Lin et al. |

(Continued)

FOREIGN PATENT DOCUMENTS

EP 2070641 A2 6/2009

OTHER PUBLICATIONS

Khan, Shahid Hameed, "Local Gouging detection and tool size determination for 3-axis finish machining of sculptured surface parts", Nov. 2006, Concordia University, Montreal, Quebec, Canada. pp. 3-127.*

(Continued)

Primary Examiner — Ronald D Hartman, Jr.
(74) Attorney, Agent, or Firm — IP Delta Plus Inc.

(57) ABSTRACT

The present relates to a method for automatically determining a finishing recipe of a manufactured component. A non-finished 3D model, consisting in a 3D representation of the manufactured component at a non-finished stage, is received at a computer. And a finished 3D model, consisting in a 3D representation of the manufactured component at a finished stage, is received. The non-finished 3D model and the finished 3D model are further processed, to calculate a finishing recipe of one or more tool(s), The tool performs a finishing operation according to the finishing recipe on the manufactured component at the non-finished stage, to obtain the manufactured component at the finished stage. The finishing recipe may include a trajectory of the tool(s), an operational parameter(s) of the tool(s). The manufactured component may consist in a blade. The finishing operation may consist in profiling, polishing, tri-blending, weld blending, twist and bow.

12 Claims, 12 Drawing Sheets

(56) References Cited

U.S. PATENT DOCUMENTS

| | | | |
|---|---|---|---|
| 7,472,478 B2 | 1/2009 | Graham et al. | |
| 7,934,975 B2 | 5/2011 | Thompson | |
| 8,380,338 B2 | 2/2013 | Miller et al. | |
| 8,684,790 B2 | 4/2014 | Reinmoeller et al. | |
| 2004/0083024 A1 | 4/2004 | Wang | |
| 2009/0319077 A1 | 12/2009 | Cameron | |
| 2010/0220578 A1* | 9/2010 | Yamasaki | G11B 7/1275 369/112.23 |
| 2012/0077417 A1* | 3/2012 | Derrien | B23P 6/00 451/5 |
| 2012/0094577 A1* | 4/2012 | Gourraud | B24B 13/06 451/5 |
| 2012/0124834 A1 | 5/2012 | Cholet et al. | |
| 2013/0035781 A1* | 2/2013 | Cameron | B25J 9/1692 700/186 |

OTHER PUBLICATIONS

Yu, Hua-dong et al., "New Principle on High-order Aspherical Machining by CNC Tangent Method," <http://ieeexplore.ieee.org/stamp/stamp.jsp?arnumber=6035262>, 2011, IEEE, Electromechanics College, Changchun University of Science and Technology, Changchun, China, pp. 721-725.*

* cited by examiner

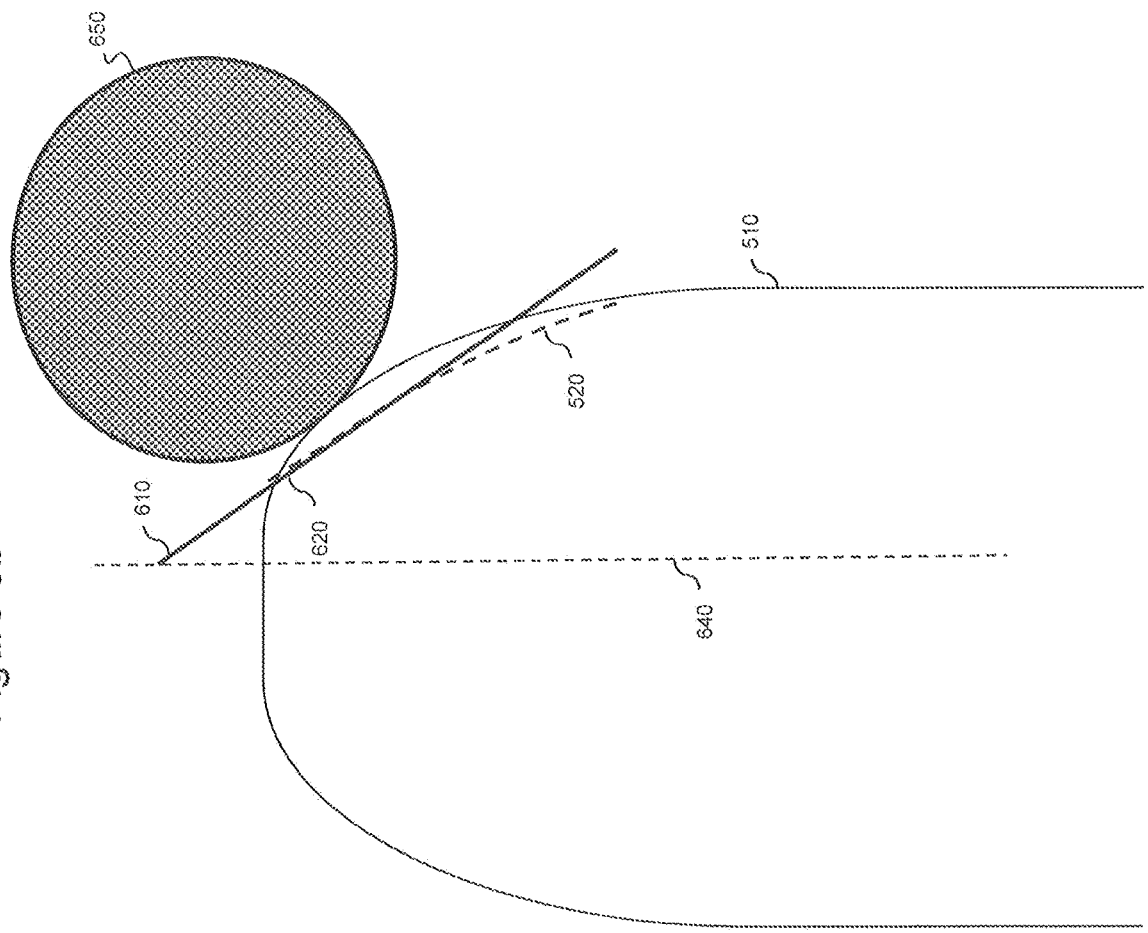

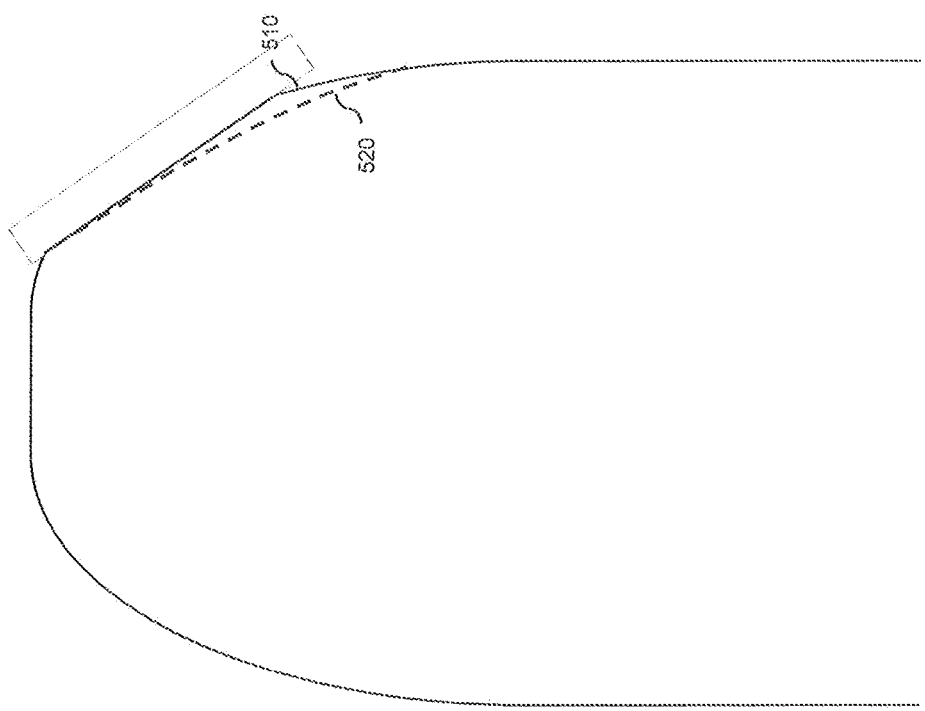

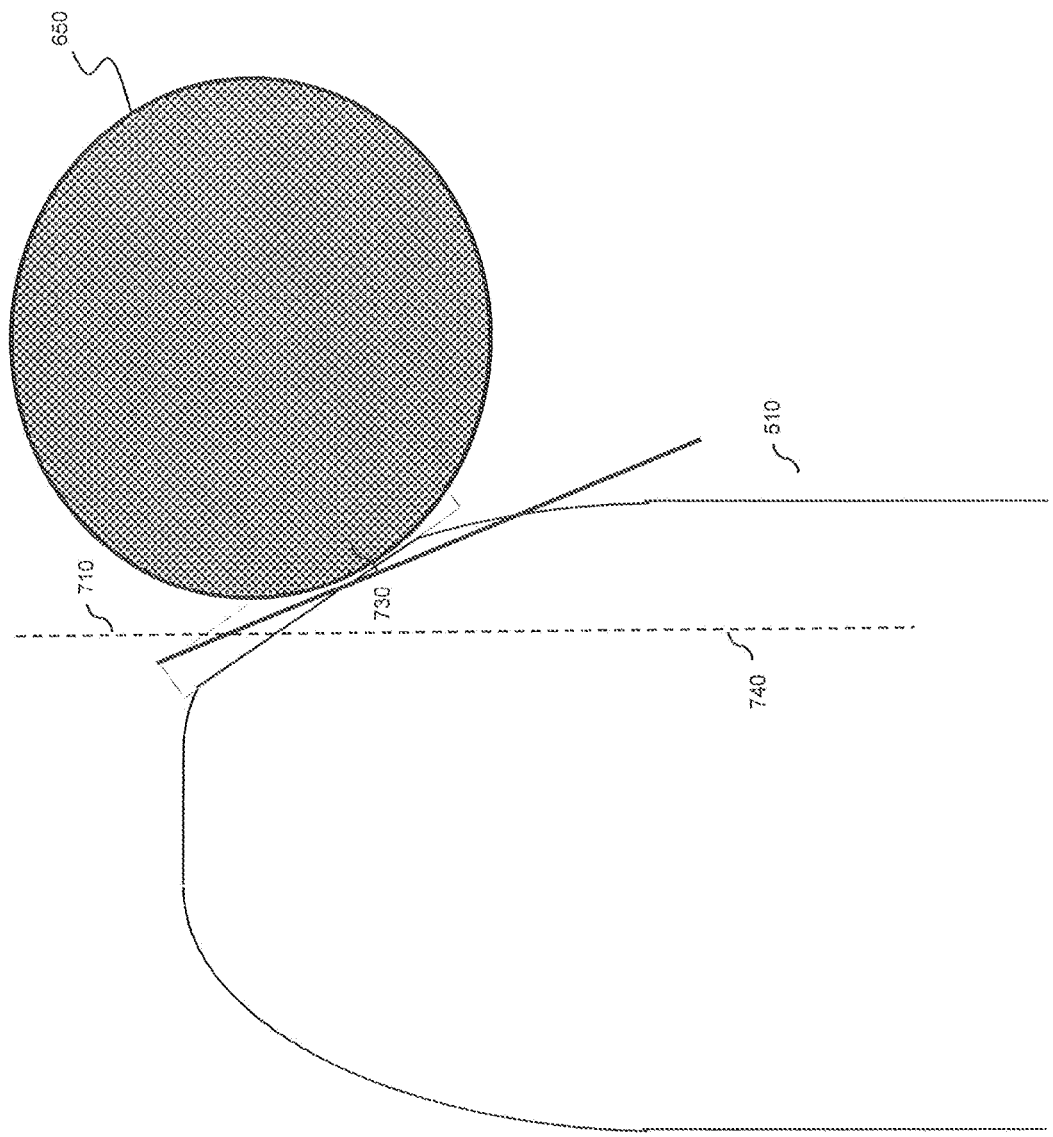

METHOD FOR AUTOMATICALLY DETERMINING A FINISHING RECIPE OF A MANUFACTURED COMPONENT

TECHNICAL FIELD

The present disclosure relates to the field of automated manufacturing. More specifically, the present disclosure relates to a computer-implemented method for automatically determining a finishing recipe of a manufactured component.

BACKGROUND

Automated manufacturing is widespread in multiple industries, including for example the automotive industry, the aeronautic industry, etc. The use of computer-controlled manufacturing devices (e.g. robots) instead of humans for performing specific manufacturing tasks has several advantages. For instance, a computer-controlled manufacturing device may be more productive than a human for performing simple repetitive manufacturing tasks. And a computer-controlled manufacturing device may be more effective than a human for performing complex manufacturing tasks requiring a high level of accuracy.

A specific type of manufacturing operation consists in performing a finishing operation on a manufactured component at an intermediate stage, in order to obtain a manufactured component at a final stage. This finishing operation is performed by a dedicated finishing tool. Blades are an example of manufactured components which may require a finishing operation. Blades are used in the aeronautic or the energy industries, and are critical components for these industries. Thus, very strict requirements are applied to the shape of specific sections of a blade, like for example the edge of a blade. Finishing operations, performed by dedicated finishing tools, are usually necessary to obtain the final shape of the blade. Such finishing operations include for example profiling and/or polishing.

The finishing tool may be operated by a human, or may be automatically controlled. For example, the finishing tool may follow the surface of the component (or vice-versa), and remove a specific amount of material from the surface of the component (the amount may vary based on the current position of the finishing tool on the surface). However, the precision of the finishing operation may not be sufficient, and a significant amount of rework may be needed, in order to comply with specifications of the finished component.

Furthermore, the finishing tool may be used to finish different types of components, each having its own requirements.

At the moment, a finishing recipe for automatically controlled finishing tool is obtained by successive trial and errors performed by one or several operators, until a 'good enough' finishing recipe is obtained. The trial and errors require operator and equipment time, and the finishing recipe is appropriate as long as the components to be finished remain within a certain range of variations.

Therefore, there is a need for a computer-implemented method for automatically determining a finishing recipe of a manufactured component, which overcomes the aforementioned limitations.

SUMMARY

According to a first aspect, the present disclosure provides a computer-implemented method for automatically determining a finishing recipe of a manufactured component. The method comprises receiving, at a computer, a non-finished 3D model consisting in a 3D representation of the manufactured component at a non-finished stage, and a finished 3D model consisting in a 3D representation of the manufactured component at a finished stage. The method further comprises processing, at the computer, the non-finished 3D model and the finished 3D model to determine an initial finishing recipe of one or more finishing tool(s). The finishing tool performs a finishing operation according to the calculated initial finishing recipe on the manufactured component at the non-finished stage, to obtain the manufactured component at the finished stage. The method further compares the manufactured component at the finished stage with the 3D representation of the manufactured component at the finished stage, to identify quantitative differences. The method further applies a convergence algorithm to the initial finishing recipe using the quantitative differences to obtain a converged finishing recipe.

According to a second aspect, the present disclosure provides a computer program product deliverable via computer-readable media such as storage media and communication links. The computer program product comprises instructions for automatically determining a finishing recipe of a manufactured component. The instructions, when executed by a processor, effect a reception of a non-finished 3D model consisting in a 3D representation of the manufactured component at a non-finished stage, and of the manufactured component at a finished stage. The instructions further effect a processing of the non-finished 3D model and the finished 3D model to calculate an initial finishing recipe of a finishing tool. The finishing tool performs a finishing operation according to the calculated initial finishing recipe on the manufactured component at the non-finished stage, to obtain the manufactured component at the finished stage. The computer program product further compares the manufactured component at the finished stage with the 3D representation of the manufactured component at the finished stage, to identify quantitative differences. The computer program product further applies a convergence algorithm to the initial finishing recipe using the quantitative differences to obtain a converged finishing recipe.

According to a third aspect, the present disclosure provides a system for automatically determining and applying a finishing recipe of a manufactured component. The system comprises a computer implementing the aforementioned computer-implemented method for calculating a finishing recipe. And the system comprises a finishing tool performing a finishing operation on the manufactured component according to the calculated finishing recipe.

According to a fourth aspect, the finishing recipe comprises at least one of: a trajectory of the tool performing the finishing operation, and an operational parameter of the tool performing the finishing operation.

According to a fifth aspect, the finishing operation consists in one of: profiling, polishing, tri-blending, weld blending, and twist and bow.

According to a sixth aspect, the manufactured component consists in a blade.

According to a seventh aspect, measured characteristics of a manufactured component at the finished stage are compared to corresponding characteristics of a model of the manufactured component at the finished stage, and differences between the measured characteristics and the corresponding characteristics are used to optimize the calculation of the finishing recipe.

BRIEF DESCRIPTION OF THE DRAWINGS

Embodiments of the disclosure will be described by way of example only with reference to the accompanying drawings, in which:

FIGS. 6a to 6c illustrate a first pass of a trajectory for profiling the section of the blade of FIG. 5, according to a non-restrictive illustrative embodiment;

FIGS. 7a to 7c illustrate a second pass of the trajectory for profiling the section of the blade of FIG. 5, according to a non-restrictive illustrative embodiment.

DETAILED DESCRIPTION

The foregoing and other features will become more apparent upon reading of the following non-restrictive description of illustrative embodiments thereof, given by way of example only with reference to the accompanying drawings. Like numerals represent like features on the various drawings.

TERMINOLOGY

The following terminology is used throughout the present disclosure:

Profiling: milling an irregular profile.

Polishing: to smooth a surface by means of friction.

Tri-blending: machining of a junction between a foil and a platform according to customer requirements.

Weld blending: removing of excess weld material to blend with base material.

Twist and bow: twisting and blending sections of a foil to obtain a predetermined 3D shape.

The present disclosure relates to a computer implemented method for automatically determining a finishing recipe of a manufactured component. The present disclosure further relates to a computer-implemented method for dynamic optimization of a finishing recipe.

Figure 1:
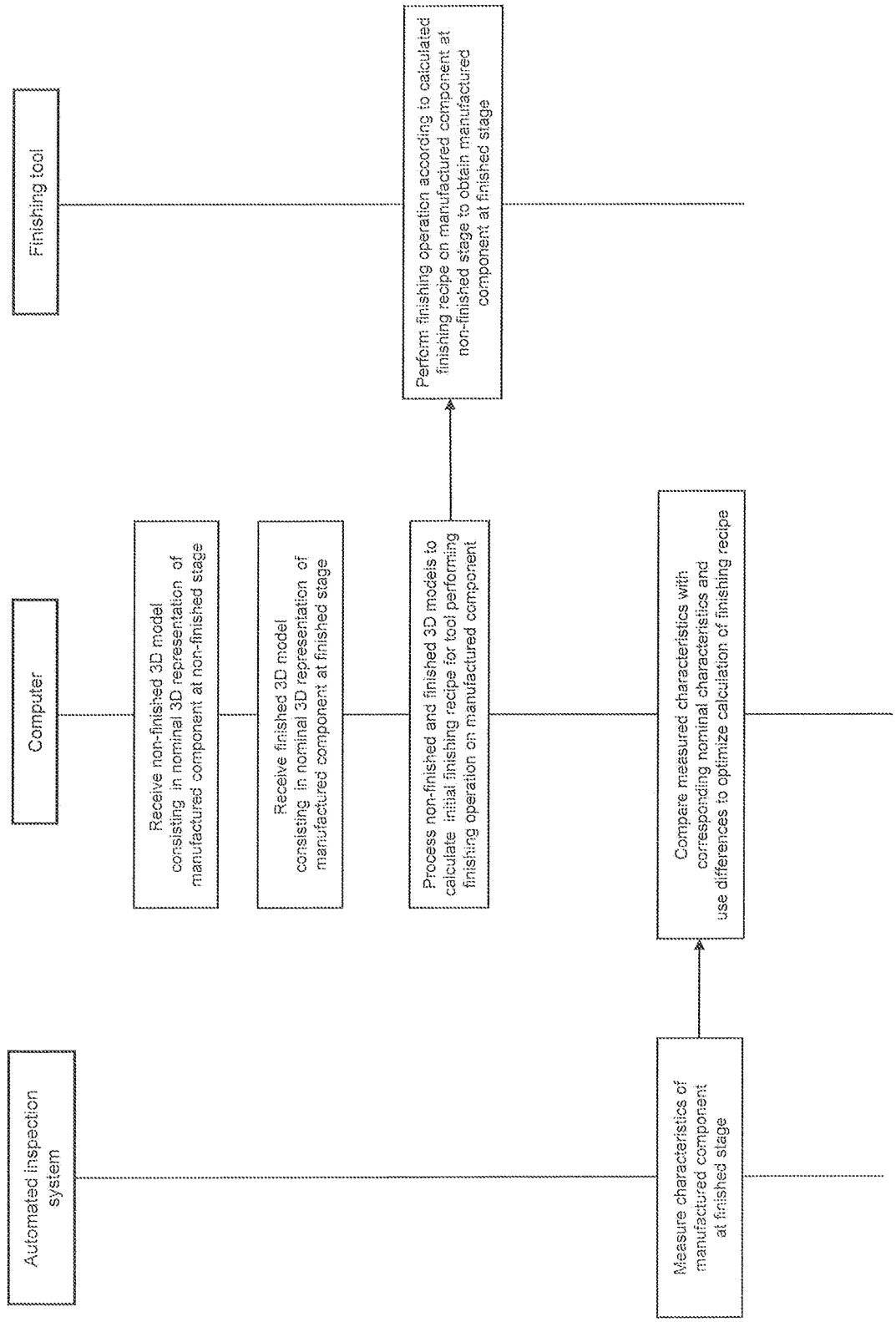
FIG. 1 illustrates a computer-implemented method for automatically determining a finishing recipe of a manufactured component, according to a non-restrictive illustrative embodiment.

Reference is now made to FIG. 1, which represents a flowchart illustrating the present computer-implemented method. A non-finished 3D model, consisting in a 3D representation of a manufactured component at a non-finished stage, is received at a computer. A finished 3D model, consisting in a 3D representation of the manufactured component at a finished stage, is also received at the computer. Alternatively, the finished 3D model could consist in a 3D representation obtained by means of measurements of a manufactured component to be replicated, also sometimes referred to in the industry as a "golden component".

Then, the computer processes the non-finished 3D model and the finished 3D model, to calculate an initial finishing recipe of a tool performing a finishing operation on the manufactured component at the non-finished stage, to obtain the manufactured component at the finished stage. The initial recipe is transmitted by the computer to the finishing tool. The finishing tool performs the finishing operation according to the initial recipe on the manufactured component. An inspection system compares the manufactured component at the finished stage with the 3D representation of the manufactured component at the finished stage, to identify quantitative differences. The computer receives the quantitative differences, and applies a convergence algorithm to the initial finishing recipe with the quantitative differences to obtain a converged finishing recipe. The convergence is done by modifications of the path and parameters of a known recipe or a previously used recipe. The method continues by iteratively using, the converged finishing recipe for finishing subsequent manufactured components, comparing the manufactured component with the 3D representation of the manufactured component at the finished stage to identify quantitative differences, and applying the convergence algorithm to the converged finishing recipe with the quantitative differences to optimize the converged finishing recipe. Depending on the level of precision required of the manufactured component and/or of the precision of the finishing tool and/or predetermined tolerated quantitative differences, the present method may repeat the inspection and convergence steps after finishing each manufactured component, or after a certain number of finished manufactured components, or a combination of both.

The non-finished 3D model is a theoretically perfect 3D representation, which accurately complies with specifications of the manufactured component at the non-finished stage. Similarly, the finished 3D model is a theoretically perfect 3D representation, which accurately complies with specifications of the manufactured component at the finished stage. Both 3D models may be generated by a Computer Aided Design (CAD) software executed on the current computer, or on a different computer and transmitted to the current computer. 3D representation can to both a virtual graphical representation or to measurements obtained the system inspection device.

In a particular aspect, the calculated finishing recipe includes a calculated trajectory of the tool performing the finishing operation. The trajectory defines physical interactions of the finishing tool with the manufactured component, when performing the finishing operation. For instance, the manufactured component is held in a fixed position by a supporting device, and the finishing tool is in movement with respect to the manufactured component to perform the finishing operation. The movement of the finishing tool is controlled by a processing unit, capable of interpreting the calculated trajectory. The processing unit transforms the calculated trajectory in effective movements of the finishing tool for performing the finishing operation. The calculated trajectory is representative of a point (or surface) of contact between the manufacturing component and the finishing tool, the finishing operation occurring at the point (surface) of contact.

Alternatively, the finishing tool may include a fixed part performing the finishing operation, and a moving part for moving the manufactured component with respect to the fixed part. In this case, the calculated trajectory is transformed by a processing unit in movements of the moving part holding the manufactured component. The movements of the moving part adequately position the manufactured component with respect to the fixed tool performing the finishing operation.

In another particular aspect, the calculated finishing recipe includes one or more operational parameter(s) of the tool(s) performing the finishing operation. For example, if the finishing tool includes a rotating element for performing the finishing operation (e.g. an abrasive rotating wheel), the feed of the rotating element against the part to be finished may be calculated by the present method, based on the non-finished and finished 3D models. The feed of the rotating part determines the amount of material removed from the manufactured component. Thus, by varying the feed, more or less material is removed. By comparing the non-finished and finished 3D models, a theoretical amount of material to remove is determined at a specific position of the manufactured component. Then, algorithms and mathematical equations are used to convert the theoretical amount of material to remove in a corresponding feed. For example, the following equation may be used: feed=Bias*Surface Feet Per Minute/area, where area is the theoretical amount of material to remove. Another parameter may be the pressure to be applied by the finishing tool. The amount of material removed is also dependent on the applied pressure. Thus, having the theoretical amount of material to remove, a corresponding pressure may be calculated. In some case it is possible that a combination of parameters variation can be used.

In another aspect, the finishing operation consists in one of: profiling, polishing, tri-blending, weld blending, and twist and bow. However, the present disclosure is not limited to these examples of finishing operations, but is applicable to any type of finishing operation, for which a finishing recipe may be determined using the present method.

In still another aspect, the manufactured component is a blade used in the aeronautic industry or other industries as the energy industry. As previously mentioned, blades are critical components for these industries, with for example strict requirements applied to the shape of specific sections of these blades. To comply with these requirements, one or several finishing operations (including for example profiling, polishing, tri-blending, weld blending, and twist and bow) may be required. Thus, the present method may be applied to automatically determine a specific finishing recipe for a specific finishing operation to be performed on the blades. However, the present disclosure is not limited to blades, but is applicable to any type of manufactured component, for which a finishing recipe may be determined using the present method.

In yet another aspect, the finishing recipe determined by the present method is further optimized. There may be a need for a further optimization, because the finished manufactured component obtained by applying the (initial and/or converged) finishing recipe does not have the proper quality. For example, the shape of the finished manufactured component may not be within pre-defined tolerance margins.

One reason for having a finished manufactured component without the proper quality is that the 3D models used for the finishing recipe are not exactly identical to the real manufactured component at the finished and non-finished stages. Another reason is that tool efficiency and precision may vary over time, thus rendering precision of the manufactured component more difficult to achieve. Finally, because of the large number of variables and their dynamic relation, a static and predetermined finishing recipe is not efficient.

The optimization of the finishing recipe uses a convergent optimization approach based on applying finishing tests on manufactured components at the finished stage, obtained from a finishing tool performing the finishing operation according to the finishing recipe. The optimization may take place in a pre-production environment, to fine tune the initial finishing recipe, before effectively starting a production of the finished components according to the finishing recipe. The optimization may furthermore take place in production environment, to dynamically adjust the converged finishing recipe so as to take into consideration the quality of the manufactured components to be finished, the precision and use of the finishing tool, environmental factors, etc.

More specifically, characteristics of a manufactured component at the finished stage are measured, and compared to corresponding characteristics of a model of the manufactured component at the finished stage. Quantitative differences between the measured characteristics and the corresponding characteristics are used to optimize the algorithms(s) used for the calculation of the finishing recipe. For example, if more material must be removed from a specific area, the feed factor can be reduced for that area, resulting in an increase of the amount of material removed. This process is repeated until the required quality is achieved when applying the finishing recipe. The process may also be temporarily deactivated when the required quality is maintained, and reactivated when the required quality is not met.

In a particular embodiment, the measured characteristics of a manufactured component at the finished stage are determined by an automated inspection system. Various inspection technologies are known in the art, and could be used independently or concurrently to measure the model at the finished stage, such as for example laser inspection systems, infrared inspection systems, mechanical inspection systems, etc.

This process may also be implemented during live production of the manufactured components, to ensure constant quality even if external variables change over time. For example, the efficiency of the abrasive wheel, the efficiency of a polishing component, etc. To minimize the risks associated with live production adjustments, algorithms are used to reduce quality risks associated with a real time change in the finishing recipe. For example, these algorithms use averaged values of the measured characteristics over numerous manufactured components instead of only one, put more weight on more recent manufactured components, eliminate data from abnormal manufactured components, limit the convergence correction between each manufactured component, etc.

EXAMPLE OF FINISHING RECIPE FOR PROFILING A BLADE

An example of a finishing recipe for profiling a blade edge will now be detailed. The finishing tool used for profiling the blade may be an abrasive wheel or a sand belt moving perpendicularly along an edge of the blade. Following is an algorithm to determine a trajectory of the profiling tool with respect to the edge of the blade.

The profiling operation consists in modifying the shape of the blade, from an intermediate shape at a non-finished stage of the blade, to a final shape at a finished stage of the blade. To be able to respect the required final shape, a certain number of passes is needed. Each pass is defined by an angle, and the angles of the passes determine the final shape. Higher the number of passes, and more continuous the profile is.

Figure 2B:
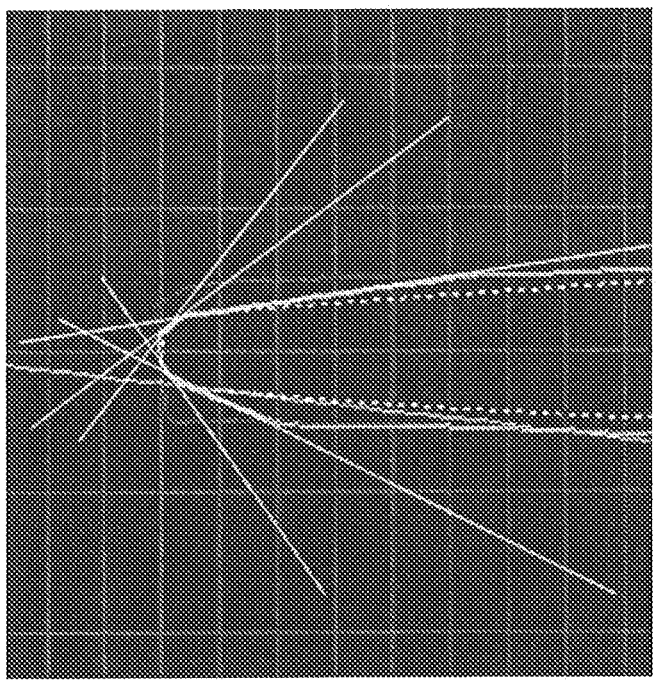
FIGS. 2A and 2B respectively illustrate a 3D model of a blade and a profile of a section of the blade, according to a non-restrictive illustrative embodiment.
Figure 2A:
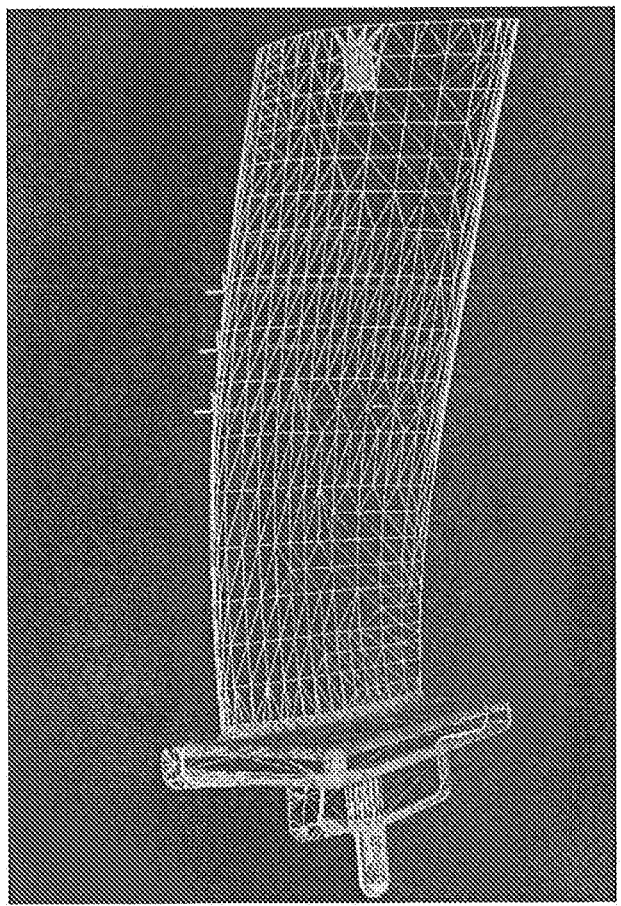

A series of algorithms analyses a profile for each section of the blade, to determine the number of passes for this section and the angles of theses passes. The profile of a section of the blade is determined based on the finished 3D model consisting in a 3D representation of the blade at a finished stage. FIG. 2a shows a 3D representation of a blade, which may illustrate the 3D representation of the blade at a finished stage. FIG. 2b shows a profile of a section of the blade of FIG. 2a, which may illustrate the profile of the blade. The number of passes for a specific profile corresponding to a specific section of the blade is established automatically according to certain rules, as per the following sequence.

A first step consists in a determination of the first pass for each side of the blade. This pass is calculated by determining a line passing at a point near the blade tip and tangent to the side of the blade. The position of this point is located on a horizontal line tangent to the blade tip, at a predetermined distance from the profile. There is one point on each side of the tip. Once these two points are determined, the distance between these two points is calculated. The distance shall be between a minimal and a maximal value. If the distance falls outside theses limits, the two points are moved on the horizontal line, so that the distance between the two points falls inside theses limits. The first pass consists in a line passing at this point and tangent to the profile without touching the opposite edge.

A second step consists in a determination of the number of passes. The number of passes is determined by calculating the minimum number of passes required to meet the following rules. An angle is calculated between the first pass and a last pass. The last pass is tangent to the blade at a specific height (e.g. where the profiling ends) without touching the other edge. Depending on the profile requirement, a minimum delta angle between two passes is set. The number of passes is the minimum number of passes required to respect the minimum delta angle between two passes, having determined the first and last passes, and the angles of the first and last passes.

When the first pass, the last pass and the number of passes are determined, a third step consists in determining the intermediate passes, and their respective angles. Other algorithms are used for this purpose. For instance, the angles of the intermediate passes are calculated by the algorithms, in order to minimize the amount of material left on top of the profile. For illustration purposes, three passes on each side of the profile of the blade are represented on FIG. 2b.

Figure 3:
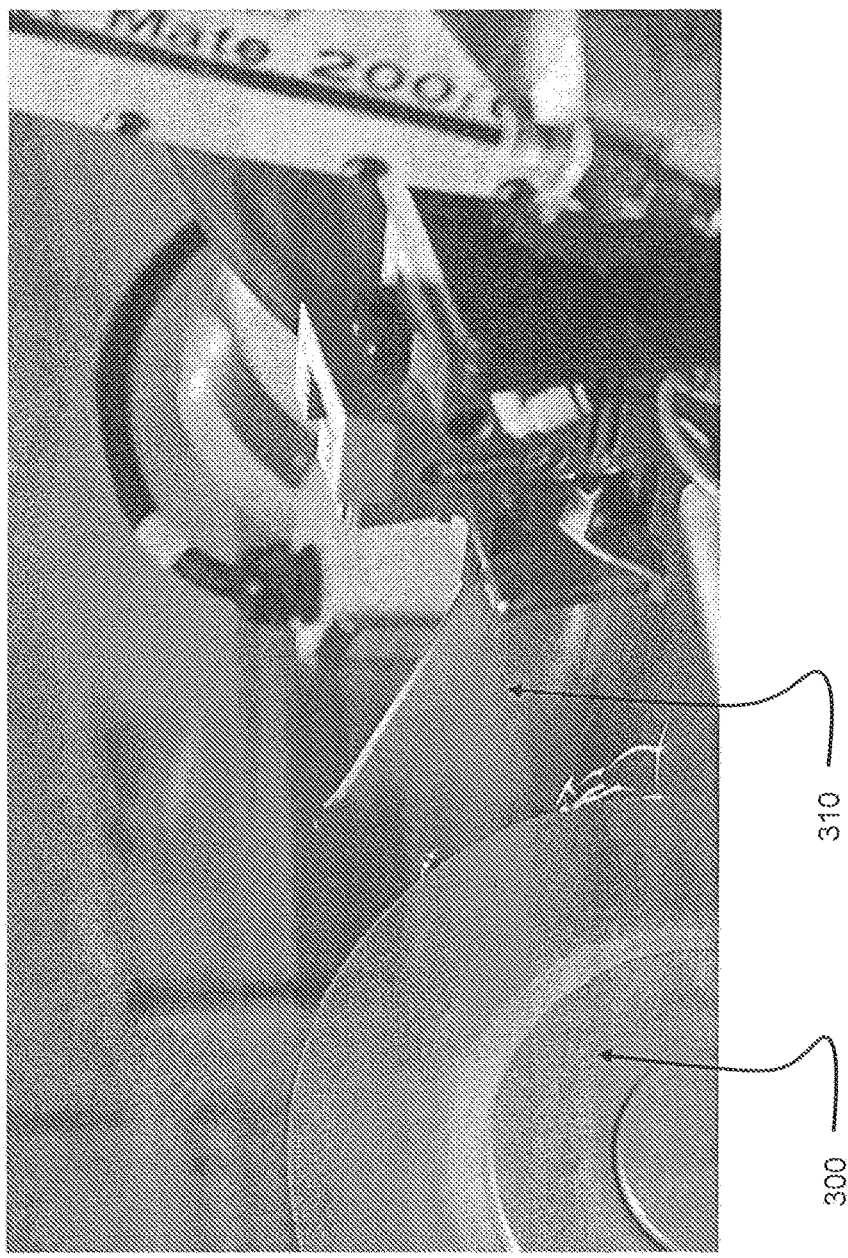
FIG. 3 illustrates a profiling of a blade by a finishing tool, according to a non-restrictive illustrative embodiment.

FIG. 3 illustrates a finishing tool 300 performing the profiling of the blade 310 according to the calculated recipe: for each section of the blade, execute the number of passes determined by the algorithms and follow the trajectory determined by the algorithms for each of the passes.

Now referring to FIGS. 4, 5, 6a-6c, and 7a-7c, the profiling of a blade according to a calculated trajectory will be further detailed.

Figure 4:
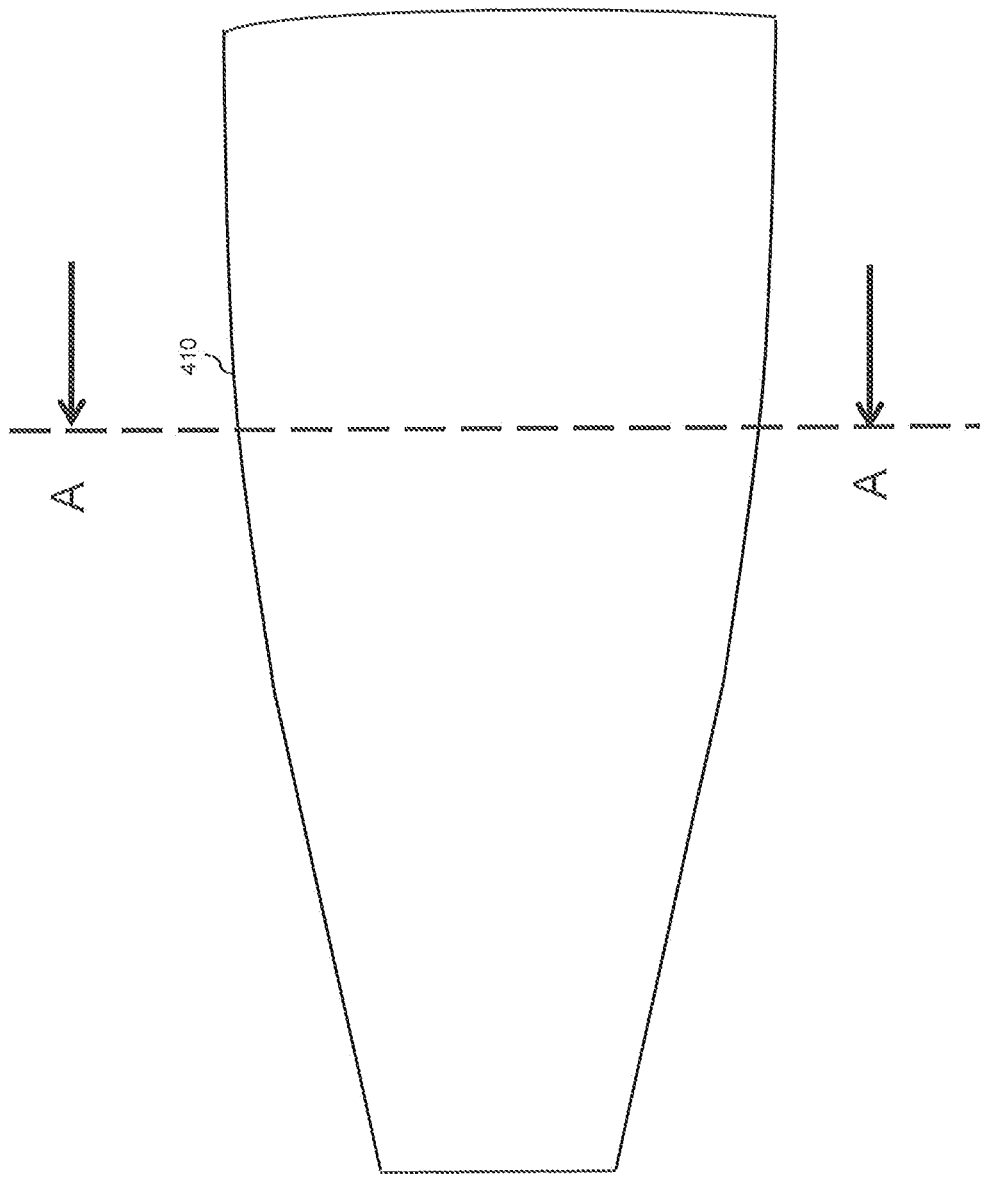
FIG. 4 illustrates a front elevation view of the blade of FIG. 2a, according to a non-restrictive illustrative embodiment.

FIG. 4 illustrates a front elevation view of the blade of FIG. 2a. For illustration purposes, a profiling operation on the upper edge 410 along the section determined by line AA is further described.

Figure 5:
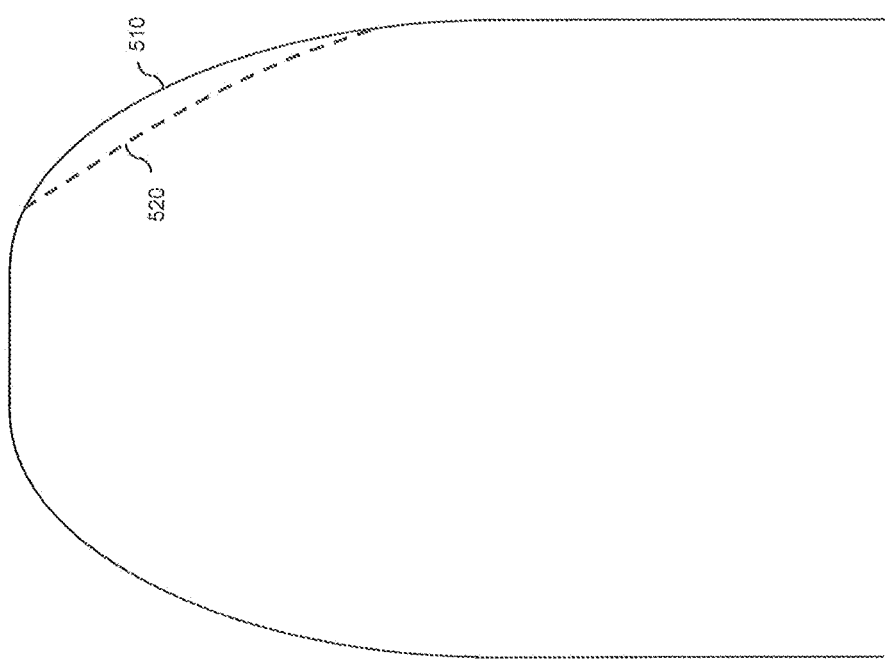
FIG. 5 illustrates a cross-sectional view of the blade of FIG. 4 as viewed from line A-A, according to a non-restrictive illustrative embodiment.

FIG. 5 illustrates a cross-sectional view of the blade of FIG. 4 as viewed from line A-A. A non-finished profile 510 and a finished profile 520 are represented. The non-finished profile 510 represents a 2D representation of a specific section of the blade at a non-finished stage. The finished profile 550 represents a 2D representation of a specific section of the blade at a finished stage. The non-finished profile 510 is extracted from a non-finished 3D model (as illustrated in FIG. 2a) consisting in a 3D representation of the blade at a non-finished stage. The finished profile 520 is extracted from a finished 3D model (as illustrated in FIG. 2a) consisting in a 3D representation of the blade at a finished stage.

Figure 6A:
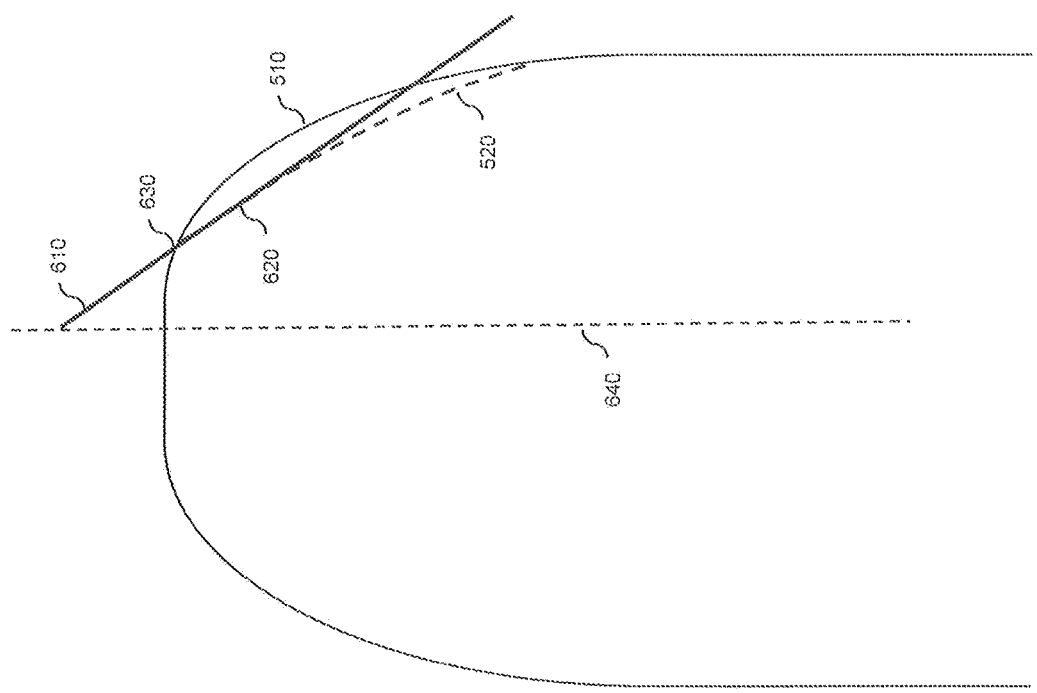

FIGS. 6a-6c illustrate a first pass of the profiling operation on the specific profile of the blade represented in FIG. 5. Referring to FIG. 6a, a tangent 610 to the finished profile 520, at a determined point of contact 620 with the finished profile 520, is calculated. The tangent 610 defines a point of contact 630 with the non-finished profile 510, and an angle with a reference vertical line 640. Referring to FIG. 6b, a trajectory of a profiling tool 650 for the first pass is illustrated. The trajectory corresponds to the tangent 610, starting at the point of contact 630 with the non-finished profile 510. More particularly, the trajectory could be following a sweep movement on various portions of the shown blade, or could follow a trajectory normal to the drawing so as to finish the blade along its length (not shown for simplicity purposes). Referring to FIG. 6c, the resulting finished profile 510 is represented, after the first pass has been performed by the profiling tool 650.

Figure 7A:
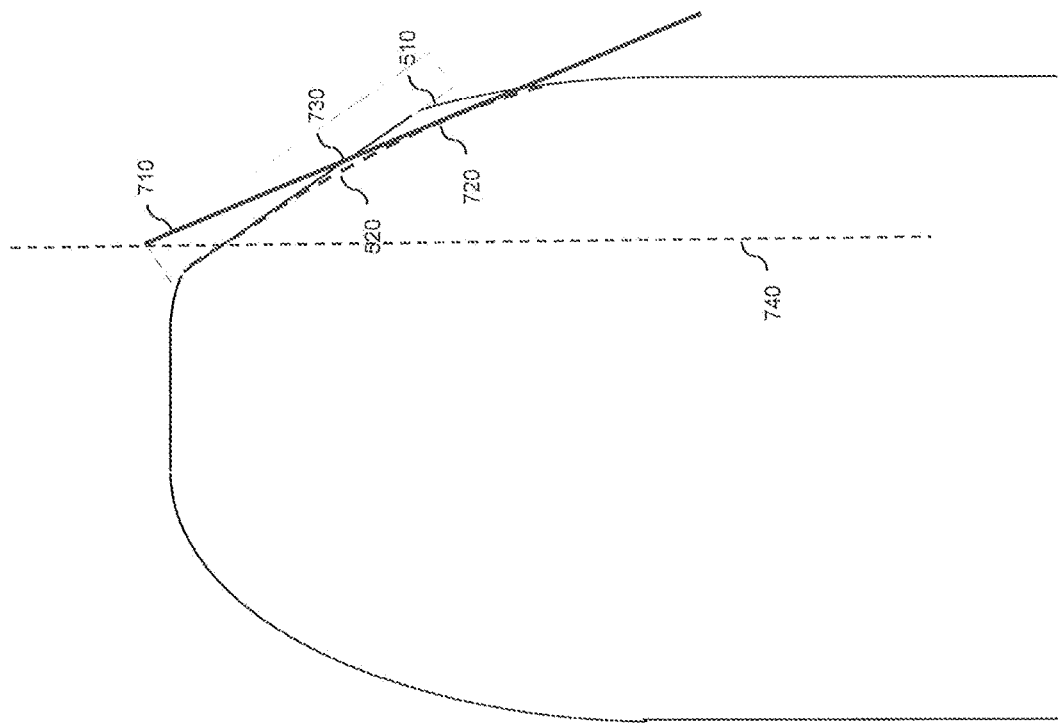
Figure 7C:
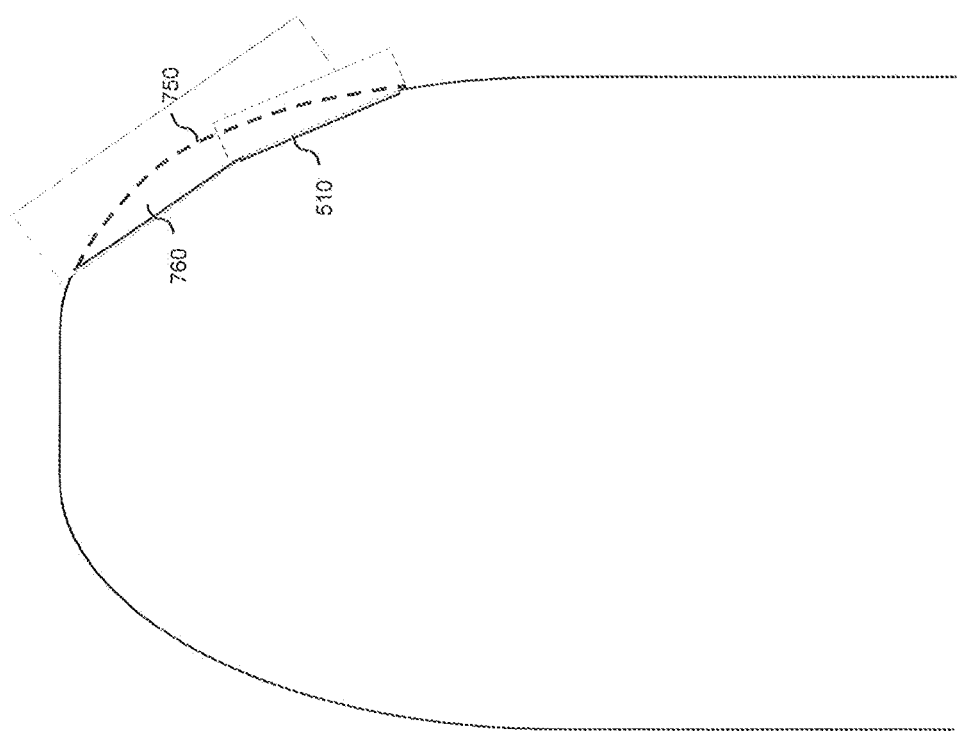

FIGS. 7a-7c illustrate a second pass of the profiling operation on the specific profile of the blade represented in FIG. 5. Referring to FIG. 7a, a tangent 710 to the finished profile 520, at a determined point of contact 720 with the finished profile 520, is calculated. The tangent 710 defines a point of contact 730 with the non-finished profile 510, and an angle with a reference vertical line 740. Referring to FIG. 7b, a trajectory of the profiling tool 650 for the second pass could be perpendicular to FIG. 7b, or proceed in sweeps along a length of the blade shown. The trajectory is defined by the tangent 710, starting at the point of contact 730 with the non-finished profile 510. Referring to FIG. 7c, the resulting finished profile 510 is represented, after the second pass has been performed by the profiling tool 650, The initial finished profile 750 (before the two passes) is also represented, to illustrate the material removed 760 by the profiling tool 650.

Additionally, the finishing recipe may include a calculation of a feed of the profiling tool 650 (e.g. abrasive wheel or sand belt) based on a determination of the amount of material to remove for each pass, as previously described in the present description. For the first pass, the material to remove is the material comprised between the tangent 610 and the non-finished profile 510, as illustrated in FIG. 6a. For the second pass, the material to remove is the material comprised between the tangent 710 and the non-finished profile 510, as illustrated in FIG. 7a.

Several principles of the previous example illustrating the calculation of the finishing recipe for the profiling of a blade may be generalized. In a particular embodiment, the finishing recipe comprises a trajectory of the tool performing the finishing operation, and the trajectory consists in several passes of the tool, each pass consisting in a sub-trajectory of the tool calculated by a computer. In another particular embodiment, an optimization algorithm is used to optimize one of: the number of passes, the sub-trajectory of the passes, or both the number of passes and the sub-trajectory of the passes. In another particular embodiment, an optimization algorithm is used to optimize one or more of: the finishing parameters. In still another particular embodiment, a sub-trajectory is a tangent to a finished 3D model (consisting in a 3D representation of the manufactured component at a finished stage) at a calculated point of the finished 3D model. The tangent defines an angle with a reference line common to a non-finished 3D model (consisting in a 3D representation of the manufactured component at a non-finished stage) and the finished 3D model. And the tangent further defines a point of contact with the non-finished 3D model.

Also, as illustrated in the previous example, processing the non-finished 3D model and the finished 3D model to calculate a finishing recipe may include extracting a non-finished 2D model and a finished 2D model from the corresponding 3D models, and processing the extracted 2D models to calculate the finishing recipe.

Although an example of a finishing recipe has been detailed for the profiling of a blade, other finishing recipes may be designed for other types of finishing operations applied to a blade, or applied to other types of manufactured components. The principles of the method remain the same: determine a finishing recipe based on the processing of the non-finished and finished 3D models of a manufactured component, and optimize the finishing recipe based on the results of quality tests performed on manufactured components obtained by applying the finishing recipe.

For example, in the case of the polishing of a blade, the determination of the finishing recipe is similar to the case of the profiling of a blade, but the surfaces taken into consideration are different: foil, platform, fillet, for polishing; instead of leading and trailing edges for profiling.

Additionally, the finishing recipe may be determined with respect to the complete manufactured component, of with respect to one or more specific features of the manufactured component. The scope of the finishing recipe depends on the specific finishing operation to be applied, and also on the specific type of manufactured component.

Regarding the optimization of the finishing recipe, in the case of polishing, tri-blending and weld blending, parameters may be optimized using the feedback of the material removed versus the material to remove. To optimize surface finishing, feedback from a Surface Roughness Tester may also be used. In the case of twist and bow, a table of force versus twist, and force versus how, may be used. These tables are created by experimentation.

The present disclosure also relates to a computer-program product for automatically determining a finishing recipe of a manufactured component. The computer program product is deliverable via computer-readable media such as storage media and communication links. The computer program product comprises instructions for automatically determining a finishing recipe of a manufactured component. The instructions of the computer program product, when executed by a computer, implement the aforementioned computer-implemented method for automatically determining a finishing recipe of a manufactured component.

The present disclosure also relates to a system for automatically determining and applying a finishing recipe of a manufactured component. The system comprises a computer implementing the computer-implemented method for calculating a finishing recipe. And the system comprises a finishing tool, performing a finishing operation on the manufactured component according to the calculated finishing recipe.

Figure 8:
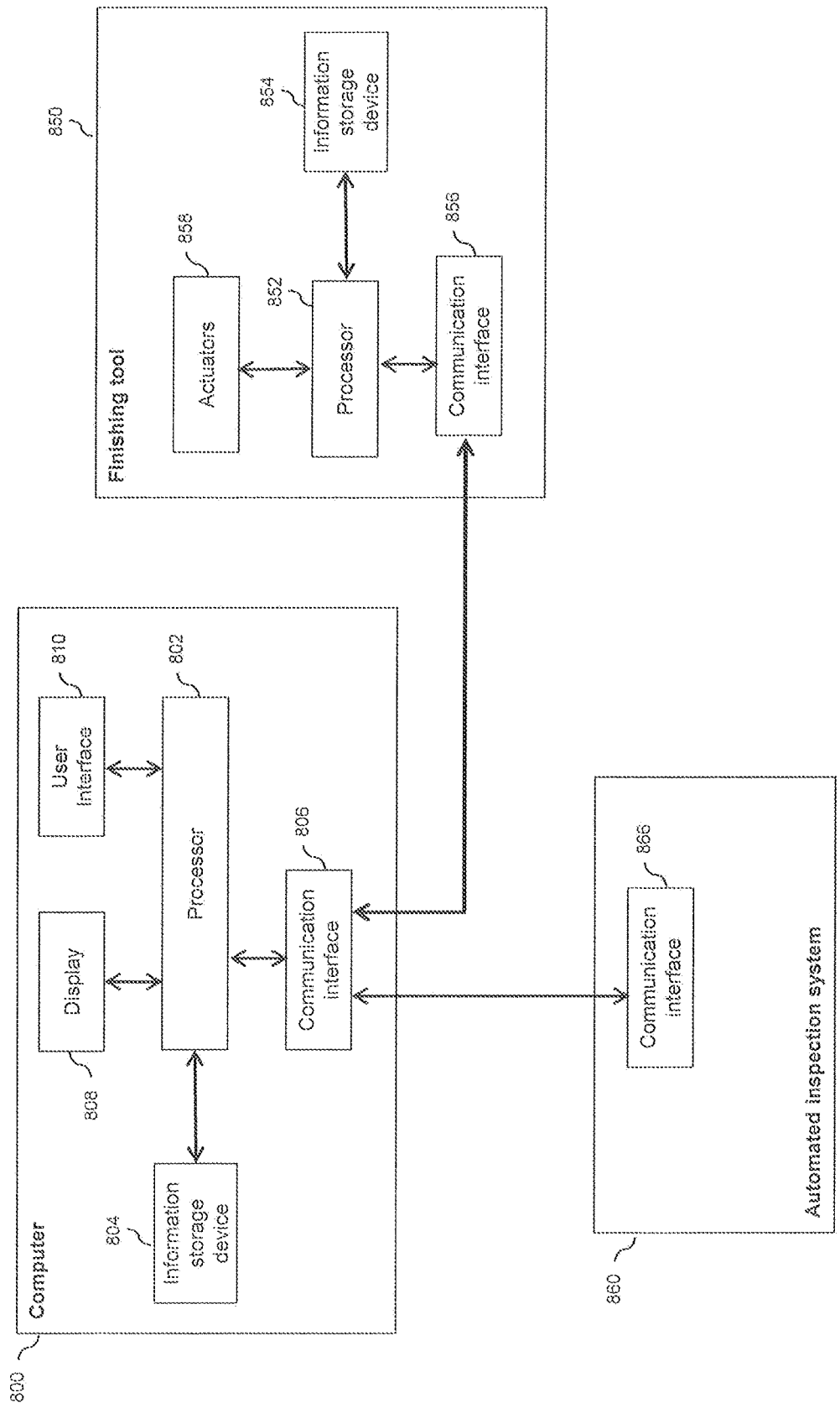
FIG. 8 illustrates a system for automatically determining and applying a finishing recipe of a manufactured component, according to a non-restrictive illustrative embodiment.

Reference is now made to Figure a, which illustrates a system for automatically determining and applying a finishing recipe of a manufactured component. A computer 800 is represented in FIG. 8. The computer 800 includes a processor 802, an information storage device 804 (e.g. a hard drive), and a communication interface 806 (connected to a local communication network and/or to a global communication network like the Internet non represented in FIG. 8). The computer-program product for automatically determining a finishing recipe of a manufactured component is stored in the information storage device 804. The instructions of the computer-program product are executed by the processor 802 (to implement the computer-implemented method for automatically determining a finishing recipe of a manufactured component). The computer program product is delivered to the computer 800 via the communication interface 806 (alternatively, it may be delivered via a physical storage media not represented in FIG. 8). The computer 800 may also include a display 808 and a user interface 810, to allow interactions with users of the system.

The non-finished and finished 3D models may be generated by a CAD software executed on a different computer (not represented in FIG. 8), and transmitted to the computer 800 via its communication interface 806. In some cases, instead of using CAD 3D models, corresponding information can be obtain from inspection by means of the system inspection device (ex: profiles from a golden blade). The 3D models are stored in the information storage device 804 and processed by the processor 802 to calculate the finishing recipe. Alternatively, the 3D models may be generated on the computer 800, via CAD software executed by the processor 802. When the finishing recipe is calculated, it is transmitted to a finishing tool 850 via the communication interface 806.

The finishing tool 850 includes a processor 852, an information storage device 804, a communication interface 806, and actuators 858. The finishing recipe is received from the computer 800 via the communication interface 856, and stored in the information storage device 854. The processor 852 interprets the finishing recipe and controls the finishing tool 850 in order to perform a finishing operation according to the finishing recipe. For example, the processor 852 interprets a calculated trajectory and transforms the calculated trajectory in effective movements of the finishing tool 850 via actuators 858.

An automated inspection system 860 is also represented in FIG. 8. The automated inspection system 860 measures characteristics of manufactured components (not represented in FIG. 8) at a finished stage (after the finishing tool 850 has performed the finishing operation according to the finishing recipe). The measured characteristics are transmitted to the computer 800 via a communication interface 866 of the automated inspection system 860. The processor 802 of the computer 800 compares the measured characteristics with corresponding characteristics (which may be stored in the information storage device 804). The processor 802 further processes the differences between the measured characteristics and the characteristics to optimize the algorithm(s) used for the calculation of the finishing recipe.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A method for finishing a manufactured component, the method comprising:
   receiving by a communication interface of a computer a non-finished 3D model consisting in a 3D representation of the manufactured component at a non-finished stage;
   receiving by the communication interface of the computer a finished 3D model consisting in a 3D representation of the manufactured component at a finished stage; and
   processing by a processor of the computer the non-finished 3D model and the finished 3D model to calculate a finishing recipe, the finishing recipe defining physical interactions of the finishing tool with the manufactured component for performing a finishing operation on the manufactured component at the non-finished stage to obtain the manufactured component at the finished stage, the calculated finishing recipe comprising a calculated trajectory of the finishing tool and at least one operational parameter of the finishing tool for execution of the finishing recipe, the at least one operational parameter comprising a feed of a rotating element of the finishing tool calculated based on the processing of the non-finished 3D model and the finished 3D model;

controlling, by a processor of the finishing tool, movement and the at least one operational parameter of the finishing tool in accordance with the finishing recipe by transforming the calculated trajectory in movements via actuators of the finishing tool during execution of the finishing recipe.

2. The method of claim 1, wherein the finishing operation consists in one of profiling, polishing, tri-blending, weld blending, and twist and bow.

3. The method of claim 1, wherein the manufactured component consists in a blade.

4. The method of claim 1, wherein measured characteristics of the manufactured component at the finished stage are compared to corresponding characteristics of the 3D model of the manufactured component at the finished stage, and differences between the measured characteristics and the corresponding characteristics are used to optimize the calculation of the finishing recipe.

5. The method of claim 4, wherein the measured characteristics of the manufactured component at the finished stage are determined by an automated inspection system.

6. The method of claim 1, wherein the at least one operational parameter further comprises a pressure applied by the finishing tool calculated based on the processing of the non-finished 3D model and the finished 3D model.

7. A system for automatically finishing a manufactured component, the system comprising:

a communication interface for receiving a non-finished 3D model consisting in a 3D representation of the manufactured component at a non-finished stage, the communication interface further receiving a finished 3D model consisting in a 3D representation of the manufactured component at a finished stage;

a processor for processing the non-finished 3D model and the finished 3D model to calculate a finishing recipe and at least one operational parameter of a finishing tool executing the finishing recipe, the at least one operational parameter comprising a feed of a rotating element of the finishing tool calculated based on the processing of the non-finished 3D model and the finished 3D model; and the finishing tool for executing the finishing recipe by transforming the calculated trajectory in movements of the finishing tool with the at least one operational parameter via actuators during execution of the finishing recipe.

8. The system of claim 7, wherein the finishing operation consists in one of profiling, polishing, tri-blending, weld blending, and twist and bow.

9. The system of claim 7, wherein the manufactured component consists in a blade.

10. The system of claim 7, wherein measured characteristics of the manufactured component at the finished stage are compared to corresponding characteristics of the 3D model of the manufactured component at the finished stage, and differences between the measured characteristics and the corresponding characteristics are used to optimize the calculation of the finishing recipe.

11. The system of claim 10, wherein the measured characteristics of the manufactured component at the finished stage are determined by an automated inspection system.

12. The system of claim 7, wherein the at least one operational parameter further comprises a pressure applied by the finishing tool calculated based on the processing of the non-finished 3D model and the finished 3D model.

* * * * *